United States Patent
Tang

(10) Patent No.: US 8,179,175 B2
(45) Date of Patent: May 15, 2012

(54) RELIABLE CHARGE PUMP CIRCUIT

(75) Inventor: Weiyun Tang, Chengdu (CN)

(73) Assignee: IPGoal Microelectronics (SiChaun) Co., Ltd., Chengdu, Sichuan Province (CN)

( * ) Notice: Subject to any disclaimer, the term of this patent is extended or adjusted under 35 U.S.C. 154(b) by 16 days.

(21) Appl. No.: 12/793,667

(22) Filed: Jun. 3, 2010

(65) Prior Publication Data

US 2010/0315154 A1    Dec. 16, 2010

(30) Foreign Application Priority Data

Jun. 11, 2009  (CN) .......................... 2009 1 0059567

(51) Int. Cl.
*H03L 7/06* (2006.01)
(52) U.S. Cl. ........................ 327/157; 327/148
(58) Field of Classification Search .................. 327/148, 327/157
See application file for complete search history.

(56) References Cited

U.S. PATENT DOCUMENTS

| | | | | |
|---|---|---|---|---|
| 6,744,292 B2* | 6/2004 | Chen et al. | ...................... | 327/156 |
| 7,102,400 B1* | 9/2006 | Mulders | .......................... | 327/157 |
| 7,130,225 B1* | 10/2006 | Terrovitis | .................. | 365/189.09 |
| 7,161,401 B2* | 1/2007 | Li | .................... | 327/157 |
| 7,176,733 B2* | 2/2007 | Haerle | ........................... | 327/157 |
| 7,408,391 B2* | 8/2008 | Haerle | ........................... | 327/157 |
| 7,616,035 B2* | 11/2009 | Haerle | ........................... | 327/157 |
| 7,692,461 B2* | 4/2010 | Haerle | ........................... | 327/157 |
| 7,893,737 B2* | 2/2011 | Haerle | ........................... | 327/157 |
| 8,049,541 B2* | 11/2011 | Haerle | ........................... | 327/157 |
| 2004/0085106 A1* | 5/2004 | Jeong | .............................. | 327/157 |
| 2005/0162200 A1* | 7/2005 | Haerle | ........................... | 327/157 |
| 2005/0189973 A1* | 9/2005 | Li | .................... | 327/157 |
| 2007/0080729 A1* | 4/2007 | Haerle | ........................... | 327/157 |
| 2008/0252342 A1* | 10/2008 | Haerle | ........................... | 327/157 |
| 2009/0121759 A1* | 5/2009 | Wang et al. | ..................... | 327/157 |
| 2009/0121760 A1* | 5/2009 | Haerle | ........................... | 327/157 |
| 2009/0201058 A2* | 8/2009 | Haerle | ........................... | 327/157 |
| 2011/0102034 A1* | 5/2011 | Haerle | ........................... | 327/157 |
| 2011/0187426 A1* | 8/2011 | Moore | ............................ | 327/157 |

* cited by examiner

*Primary Examiner* — Lincoln Donovan
*Assistant Examiner* — Adam Houston

(57) ABSTRACT

A reliable charge pump circuit includes an operational amplifier; an upper current mirror; a lower current mirror; a startup circuit; and an anti-lock circuit, wherein the anti-lock circuit includes a current source and a diode-connected NMOS transistor, which increases the driving strength of the operational amplifier to two NMOS transistors connected to an output node of the operational amplifier, so as to prevent deadlock caused by multiple stable status and improve production yield.

12 Claims, 5 Drawing Sheets

RELIABLE CHARGE PUMP CIRCUIT

BACKGROUND OF THE PRESENT INVENTION

1. Field of Invention

The present invention relates to electronic field, and more particularly, relates to a reliable charge pump circuit which can ensure proper functionality in all conditions.

2. Description of Related Arts

Both Phase-Locked Loop (PLL) and Delay Locked Loop (DLL), require to obtain a phase difference between their own output signal and input reference signal, then integrate this phase difference via a charge pump circuit, and the integrated result is reflected in control voltage VCTRL in form of varying quantity of voltage. The control voltage VCTRL is used to control a voltage controlled oscillator VCO or a voltage controlled delay line VCDL, until their phases are synchronous. The system to achieve above phase-locked loop lock process (PLL) is shown in FIG. 1.

The relevant reference is the following U.S. patents:
CHARGE PUMP CIRCUIT
U.S. Pat. No. 6,535,051 B2 March 2003 Kyu-hyoun Kim
HIGH OUTPUT IMPEDENCE CHARGE PUMP FOR PLL/DLL
U.S. Pat. No. 7,176,733 B2 February 2007 Dieter Haerle During this process, if the output voltage of the charge pump is locked on a certain value owing to some reasons such as circuit's positive feedback, or existence of multiple stable status, the process for tracking and locking the frequency of the input signal will fail. On the other hand, if the phase margin of the feedback loop is not enough, that is, the phase of the loop gain is larger than 135 degree when the magnitude of the loop gain is unity, then the whole feedback loop will oscillate, and the charge pump could not work properly.

The startup and stability issues caused by the charge pump circuit are as listed below.

As shown in FIG. 2, the traditional charge pump circuit has the following problems: in the process of startup or normal work, once the voltage of net OUT is higher the voltage of the net14, it is likely to occur positive feedback to make the charge pump work improperly, that is, when the voltage of net OUT is higher than the voltage of the net14, under the effect of the Operational Amplifier 113, the voltage of the net15 decreases below the NMOS transistor's threshold voltage Vthn, then the NMOS transistors 107, 109 will be cut-off, and both the voltages of net OUT and net14 will be elevated until being near a certain voltage value, at this certain voltage value, due to cut-off of the PMOS transistors 104, 106, the voltages of net OUT and net14 stop elevating. It is noted that the certain voltage value is one threshold value of PMOS transistor less than the net16.

Firstly, if at the end of the above process, the voltage of the net OUT is higher than the voltage of the net14, the final state is the NMOS transistors 107, 109 and the PMOS transistors 104, 106 will be all cut-off, that is, the state that the voltage of the net OUT is higher than the voltage of the net14 keeps being locked up, so that the charge pump could not work properly.

Secondly, even if at the end of the process the voltage of the net OUT is less than the voltage of the net14, then under the effect of the Operational Amplifier 113, the net15 is elevated, due to the effect of the NMOS transistors 107, 109, the voltages of the net OUT and the net14 will decrease, and once the net OUT is higher than the voltage of the net14, the process described above will repeat again to cause oscillation. In other words, the operational amplifier 113 and the NMOS transistors 107,109 form a negative feedback loop and a positive feedback loop. Making a small signal analysis for entire circuit system, once the phase margin of the negative feedback loop is not enough, the system will oscillate, and the charge pump will not work properly.

Furthermore, if adding a startup circuit in the charge pump circuit, that is, NMOS transistors 111, 112, which make sure that the net OUT is lower than the voltage of the net14 during startup process. However, once there are some disturbances making the net OUT higher than the voltage of the net14 during working process, the problem described above will still occur.

Making a small signal analysis, the open-loop transferring function of the negative feedback loop is obtained from an equivalent circuit of small signal as shown in FIG. 4, which can be expressed by the following Equation:

$$\frac{Vout}{Vin}(s) = \frac{G1 \cdot R1}{1 + R1 \cdot C1s} \cdot \frac{G2 \cdot R2}{1 + R2 \cdot C2s} = \frac{G1/C1}{s + 1/(R1 \cdot C1)} \cdot \frac{G2/C2}{s + 1/(R2 \cdot C2)}$$

here, $W1 = 1/(R1 \cdot C1)$, $W2 = 1/(R2 \cdot C2)$, because the two poles are approximately equal to each other, resulting that the phase margin is not enough, so the entire system is not stable.

SUMMARY OF THE PRESENT INVENTION

An objective of the present invention is to provide a reliable charge pump circuit which can prevent deadlock or oscillation during the frequency locking process, so as to ensure proper functionality.

Accordingly, in order to accomplish the above objective, the present invention provides a reliable charge pump circuit, comprising:
an operational amplifier;
an upper current mirror;
a lower current mirror;
an integral capacitor;
a startup circuit; and
an anti-lock circuit,
wherein the anti-lock circuit comprises a current source and a diode-connected (the "diode-connected" is one type of transistor connections in a complementary metal oxide semiconductor (CMOS) integrated circuit, which is characterized as its drain node and its gate node are connected) NMOS transistor, which is equivalent of adding a low resistor to an output node of the operational amplifier, so as to increase the driving strength of the operational amplifier to two NMOS transistors, hence, to prevent deadlock.

The anti-lock circuit further comprises a MOS capacitor connected to a noninverting input node of the operational amplifier, for improving stability.

The diode-connected NMOS transistor is in saturation region and conducting all the time, so driven by the current source and the diode-connected NMOS transistor, the voltage value of the output node of the operational amplifier is always higher than either threshold voltage value of two NMOS transistors which are connected to the output node of the operational amplifier, then the two NMOS transistors will not be cut-off, so as to solve the deadlock problem.

An equivalent circuit of the negative feedback circuit of the charge pump circuit is as follows: a transconductance amplifier G1 is connected to an open-loop circuit of a transconductance amplifier G2, wherein a grounded capacitor C1, a grounded resistor R1 and a grounded resistor R3 are connected between the transconductance amplifier G1 and the transconductance amplifier G2, an open-loop end of the transconductance amplifier G2 is connected a grounded capacitor C2, a grounded resistor R2 and a grounded capacitors C3, wherein the grounded resistor R3 and the grounded capacitor C3 provided in the open-loop circuit are equal to the anti-lock circuit. It is worth noting that the transconductance amplifier is a kind of amplifier which can transform a voltage input signal into a current output signal.

An open-loop transfer function of the negative feedback loop can be expressed by the following Equation:

$$\frac{Vout}{Vin}(s) = \frac{G1 \cdot R1'}{1+R1' \cdot C1s} \cdot \frac{G2 \cdot R2}{1+R2 \cdot C2's} = \frac{G1/C1}{s+1/(R1' \cdot C1)} \cdot \frac{G2/C2'}{s+1/(R2 \cdot C2')}$$

here, Vout/Vin(s) is a Laplace transform for a ratio of the output signal to the input signal, i.e., the transfer function;

G1 is equivalent to a transconductance amplifier of the operational amplifier in the reliable charge pump circuit;

R1' is equivalent to a resistor connected between the output node of the operational amplifier and the ground;

C1 is equivalent to a capacitor connected between the output node of the operational amplifier and the ground;

G2 is equivalent to a transconductance amplifier of the NMOS transistor which is connected to the output node of the operational amplifier, here, the NMOS transistor plays a role as an amplifier;

R2 is equivalent to a resistor connected between a drain node of the NMOS transistor which is connected to the output node of the operational amplifier and the ground;

C2' is equivalent to a capacitor connected between the drain node of the NMOS transistor which is connected to the output node of the operational amplifier and the ground;

s is a Laplace operator; and it is worth noting that in the above function: R1'=(R1//R3)/(R1+R3), C2'=C2+C3.

Given two poles W1=1/(R1'×C1), W2=1/(R2×C2'), (the pole is a concept in signals and systems, which means that a transfer function reaches infinity.) when W1 gets larger, W2 gets smaller, and therefore, the two poles W1, W2 are separated. W2 becomes main pole, W1 becomes secondary pole, W1 is far away from the main pole W2, so that the phase margin is increased, and stability is improved. Therefore, the key point of improving stability is to separate the pole W1 from W2 in the conventional charge pump circuit.

The beneficial effects of the present invention are illustrated as follows: firstly, the reliable charge pump circuit can improve stability of the charge pump circuit, so as to make the charge pump circuit more stable and reliable. Secondly, the reliable charge pump circuit can prevent deadlock caused by multiple stable status, so as to improve production yield.

These and other objectives, features, and advantages of the present invention will become apparent from the following detailed description, the accompanying drawings, and the appended claims.

DETAILED DESCRIPTION OF THE PREFERRED EMBODIMENT

Figure 1:
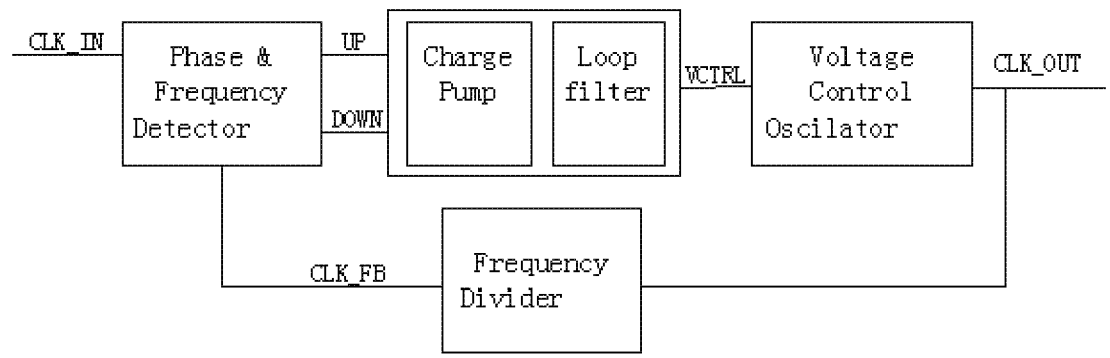
FIG. 1 is a block diagram of a prior art Phase-Locked Loop.
Figure 2:
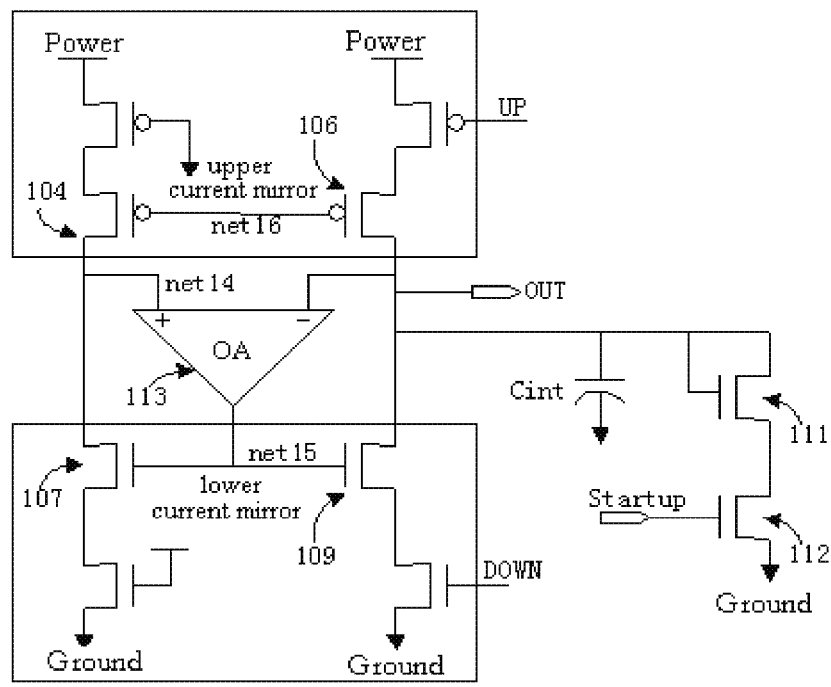
FIG. 2 is a schematic of a prior art charge pump circuit.
Figure 3:
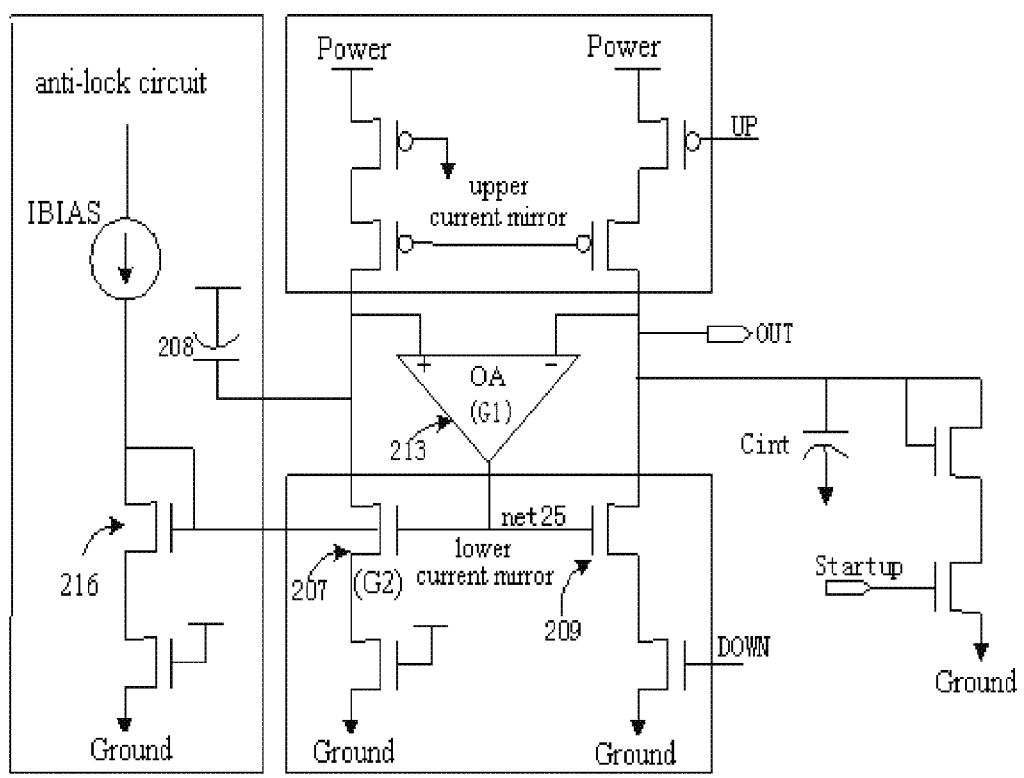
FIG. 3 is a schematic of a reliable charge pump circuit according to a preferred embodiment of the present invention
Figure 4:
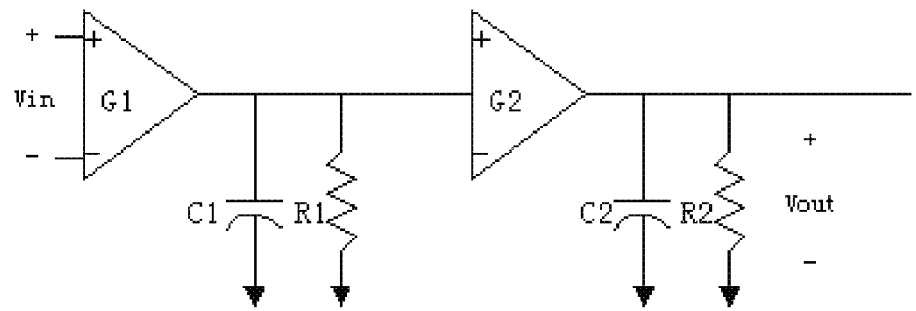
FIG. 4 is a schematic of small-signal model of negative feedback loop of a prior art charge pump circuit.

As shown in FIG. 3, a reliable charge pump circuit, comprises an operational amplifier (OA) 213; an upper current mirror; a lower current mirror; an integral capacitor Cint; a startup circuit; and an anti-lock circuit. The anti-lock circuit comprises a current source IBIAS and a diode-connected (the "diode-connected" is one type of transistor connections in a complementary metal oxide semiconductor (CMOS) integrated circuit, which is characterized as its drain node and its gate node are connected) NMOS transistor 216, which is equivalent of adding a low resistor to an output of the operational amplifier, so as to increase the driving strength of the operational amplifier to two NMOS transistors 207, 209 which are connected to an output node of the operational amplifier, hence to prevent deadlock.

The anti-lock circuit further comprises a MOS capacitor 208 connected to a noninverting input node of the operational amplifier, for improving stability.

The diode-connected NMOS transistor 216 is in saturation region and conducting all the time, so driven by the current source IBIAS and the diode-connected NMOS transistor 216, the voltage value of the output node net25 of the operational amplifier is always higher than either threshold voltage value of the NMOS transistors 207, 209 which are connected to the output node of the operational amplifier, then the two NMOS transistors 207, 209 will not be cut-off, so as to solve the deadlock problem.

An equivalent circuit of the negative feedback circuit of the charge pump circuit is as follows: a transconductance amplifier G1 is connected to an open-loop circuit of a transconductance amplifier G2, wherein a grounded capacitor C1, a grounded resistor R1 and a grounded resistor R3 are connected between the transconductance amplifier G1 and the transconductance amplifier G2, an open-loop end of the transconductance amplifier G2 is connected a grounded capacitor C2, a grounded resistor R2 and a grounded capacitors C3, wherein the grounded resistor R3 and the grounded capacitor C3 provided in the open-loop circuit are equal to the anti-lock circuit. It is worth noting that the transconductance amplifier is a kind of amplifier which can transform a voltage input signal into a current output signal.

That is, to make a quantitative mathematical analysis of the reliable charge pump circuit shown in FIG. 3 requires obtaining its small-signal equivalent circuit. Disconnecting the noninverting input node of the operational amplifier in FIG. 3, an open-loop circuit can be obtained and an equivalent circuit of this open-loop circuit is shown in FIG. 5, wherein the operational amplifier 213 in FIG. 3 is equivalent to the transconductance amplifier G1 in FIG. 5, the NMOS transistor 207 in FIG. 3 is equivalent to the transconductance amplifier G2 in FIG. 5, the apacitance and resistance between the output node of the operational amplifier and the ground in FIG. 3 are the grounded capacitor C1 and the grounded resistor R1 as shown in FIG. 5 respectively, the capacitance and resistance connected between a drain node of the NMOS transistor 207 and the ground are the grounded capacitor C2 and the grounded resistor R2 as shown in FIG. 5 respectively, and the anti-lock circuit in FIG. 3 is equivalent to an adding small grounded resistor R3 and the grounded capacitor C3 in FIG. 5.

It is worth noting that using an equivalent circuit is just for making a mathematic analysis conveniently. Therefore, as equivalence, analysis of this equivalent circuit is equivalent to analysis of the original circuit.

Figure 5:
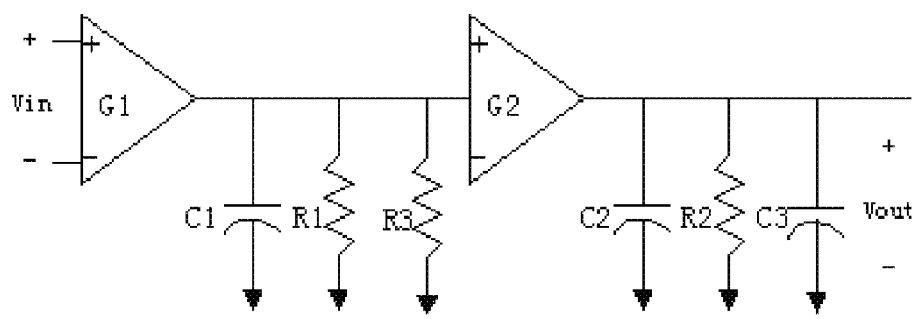
FIG. 5 is a schematic of open-loop small-signal model of negative feedback loop of the present invention.

Making a mathematic analysis of the small-signal equivalent circuit shown in FIG. 5, an open-loop transfer function of the negative feedback loop can be expressed by the following Equation:

$$\frac{Vout}{Vin}(s) = \frac{G1 \cdot R1'}{1+R1' \cdot C1s} \cdot \frac{G2 \cdot R2}{1+R2 \cdot C2's} = \frac{G1/C1}{s+1/(R1' \cdot C1)} \cdot \frac{G2/C2'}{s+1/(R2 \cdot C2')}$$

here, Vout/Vin(s) is a Laplace transform for a ratio of output signal and input signal, in other words, is the transfer function;

G1 is equivalent to a transconductance amplifier of the operational amplifier 213 as shown in FIG. 3;

R1' is equivalent to a resistor connected between the output node of the operational amplifier 213 and the ground as shown in FIG. 3;

C1 is equivalent to a capacitor connected between the output node of the operational amplifier 213 and the ground as shown in FIG. 3;

G2 is equivalent to a transconductance amplifier of the NMOS transistor 207 as shown in FIG. 3;

R2 is equivalent to a resistor connected between a drain node of the NMOS transistor 207 and the ground as shown in FIG. 3;

C2' is equivalent to a capacitor connected between the drain node of the NMOS transistor 207 and the ground as shown in FIG. 3;

s is a Laplace operator;

it is worth noting that in the above function: R1'=(R1//R3)/(R1+R3), C2'=C2+C3.

Given two poles W1=1/(R1'×C1), W2=1/(R2×C2'), here, when W1 gets larger, W2 gets smaller, and therefore, the two poles W1, W2 are separated. Make W2 becomes main pole, W1 becomes secondary pole, the main pole W1 is far away from the secondary pole W2, so that the phase margin is increased, and stability is improved. Therefore, the key point of improving stability is to separate the pole W1 from W2 in the conventional charge pump circuit.

Figure 6:
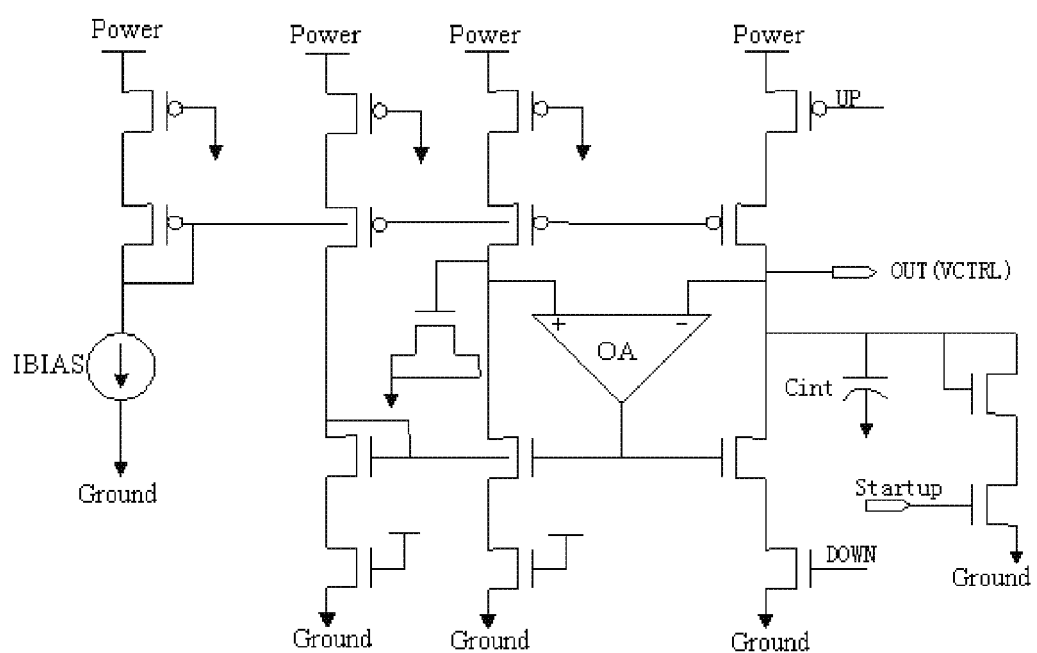
FIG. 6 is a schematic of one embodiment of the present invention.
Figure 7:
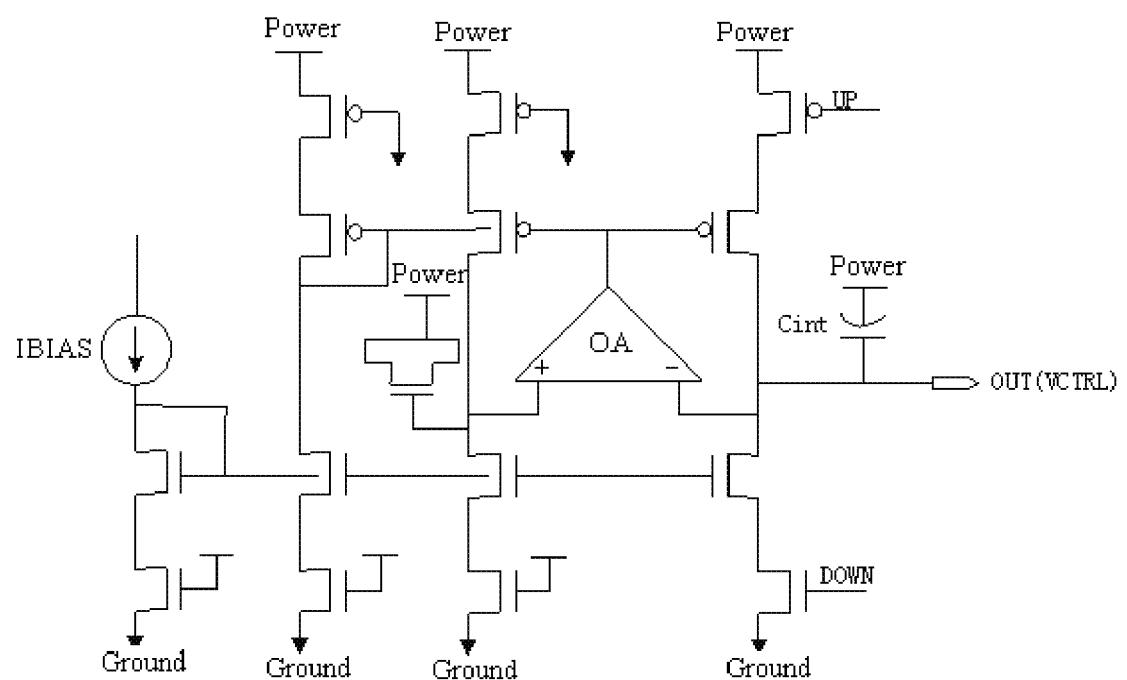
FIG. 7 is a schematic of another embodiment of the present invention.

FIG. 6 and FIG. 7 are both embodiment circuits of the present invention. The two circuits both have only one stable point, and enough margin phase and stable loop, so the charge pump circuit can work well and avoid unstable factors, such as deadlock, self-excited oscillation. The reliable charge pump circuit of the present invention can improve system stability and enhance efficiency production.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A reliable charge pump circuit, comprising:
an operational amplifier;
an upper current mirror connected to an noninverting input node and an inverting input node of said operational amplifier respectively;
a lower current mirror, comprising two NMOS transistors which are connected to an output node of said operational amplifier;
an integration capacitor connected to said inverting input node of said operational amplifier;
a startup circuit for starting the reliable charge pump circuit, connected to said integration capacitor; and
an anti-lock circuit, comprising a diode-connected NMOS transistor connected to said output node of said operational amplifier, wherein an drain node of said diode-connected NMOS transistor is connected to an gate node of said diode-connected NMOS transistor; and a current source connected to said diode-connected NMOS transistor, wherein said diode-connected NMOS transistor and said current source form a common-source drive.

2. The reliable charge pump circuit, as recited in claim 1, wherein said anti-lock circuit further comprises a MOS capacitor connected to said noninverting input node of said operational amplifier.

3. The reliable charge pump circuit, as recited in claim 1, wherein said diode-connected NMOS transistor is in saturation region and conducting all time, driven by said current source and said diode-connected NMOS transistor, an output voltage value of said operational amplifier is always higher than either threshold voltage value of two said NMOS transistors, so two said NMOS transistors are not cut-off any more, deadlock is avoided.

4. The reliable charge pump circuit, as recited in claim 2, wherein said diode-connected NMOS transistor is in saturation region and conducting all time, driven by said current source and said diode-connected NMOS transistor, an output voltage value of said operational amplifier is always higher than either threshold voltage value of two said NMOS transistors, so two said NMOS transistors are not cut-off any more, deadlock is avoided.

5. The reliable charge pump circuit, as recited in claim 1, wherein an equivalent circuit of a negative feedback circuit of the reliable charge pump circuit is expressed as follows: a transconductance amplifier G1 is connected to an open-loop circuit of a transconductance amplifier G2, wherein a grounded capacitor C1, a grounded resistor R1 and a grounded resistors R3 are connected between said transconductance amplifier G1 and said transconductance amplifier G2, an open-loop end of said transconductance amplifier G2 is connected to a grounded capacitor C2, a grounded resistor R2 and a grounded capacitors C3, wherein said grounded resistor R3 and said grounded capacitor C3 provided in said open-loop circuit is equivalent to said anti-lock circuit.

6. The reliable charge pump circuit, as recited in claim 2, wherein an equivalent circuit of a negative feedback circuit of the reliable charge pump circuit is expressed as follows: a transconductance amplifier G1 is connected to an open-loop circuit of a transconductance amplifier G2, wherein a grounded capacitor C1, a grounded resistor R1 and a grounded resistors R3 are connected between said transconductance amplifier G1 and said transconductance amplifier G2, an open-loop end of said transconductance amplifier G2 is connected to a grounded capacitor C2, a grounded resistor R2 and a grounded capacitors C3, wherein said grounded resistor R3 and said grounded capacitor C3 provided in said open-loop circuit is equivalent to said anti-lock circuit.

7. The reliable charge pump circuit, as recited in claim 3, wherein an equivalent circuit of a negative feedback circuit of the reliable charge pump circuit is expressed as follows: a transconductance amplifier G1 is connected to an open-loop circuit of a transconductance amplifier G2, wherein a grounded capacitor C1, a grounded resistor R1 and a grounded resistors R3 are connected between said transconductance amplifier G1 and said transconductance amplifier G2, an open-loop end of said transconductance amplifier G2 is connected to a grounded capacitor C2, a grounded resistor R2 and a grounded capacitors C3, wherein said grounded resistor R3 and said grounded capacitor C3 provided in said open-loop circuit is equivalent to said anti-lock circuit.

8. The reliable charge pump circuit, as recited in claim 4, wherein an equivalent circuit of a negative feedback circuit of the reliable charge pump circuit is expressed as follows: a transconductance amplifier G1 is connected to an open-loop circuit of a transconductance amplifier G2, wherein a grounded capacitor C1, a grounded resistor R1 and a grounded resistors R3 are connected between said transconductance amplifier G1 and said transconductance amplifier G2, an open-loop end of said transconductance amplifier G2 is connected to a grounded capacitor C2, a grounded resistor R2 and a grounded capacitors C3, wherein said grounded resistor R3 and said grounded capacitor C3 provided in said open-loop circuit is equivalent to said anti-lock circuit.

9. The reliable charge pump circuit, as recited in claim 5, wherein an open-loop transfer function of said negative feedback circuit is expressed by the following Equation:

$$\frac{Vout}{Vin}(s) = \frac{G1 \cdot R1'}{1 + R1' \cdot C1s} \cdot \frac{G2 \cdot R2}{1 + R2 \cdot C2's} = \frac{G1/C1}{s + 1/(R1' \cdot C1)} \cdot \frac{G2/C2'}{s + 1/(R2 \cdot C2')}$$

here, Vout/Vin(s) is a Laplace transform for a ratio of output signal and input signal;
G1 is equivalent to a transconductance amplifier of said operational amplifier in the reliable charge pump circuit;
R1' is equivalent to a resistor connected between said output node of said operational amplifier and the ground;
C1 is equivalent to a capacitor connected between said output node of said operational amplifier and the ground;
G2 is equivalent to a transconductance amplifier of said NMOS transistor which is connected to said output node of said operational amplifier;
R2 is equivalent to a resistor connected between an drain node of said NMOS transistor which is connected to said output node of said operational amplifier and the ground;
C2' is equivalent to a capacitor connected between said drain node of said NMOS transistor which is connected to said output node of said operational amplifier and the ground;
s is a Laplace operator,
wherein R1'=(R1//R3)/(R1+R3), C2'=C2+C3, given two poles W1=1/(R1'×C1), W2=1/(R2×C2'), when W1 gets larger, W2 gets smaller, therefore, said two poles W1, W2 are separated, W1 is far away from W2.

10. The reliable charge pump circuit, as recited in claim 6, wherein an open-loop transfer function of said negative feedback circuit is expressed by the following Equation:

$$\frac{Vout}{Vin}(s) = \frac{G1 \cdot R1'}{1 + R1' \cdot C1s} \cdot \frac{G2 \cdot R2}{1 + R2 \cdot C2's} = \frac{G1/C1}{s + 1/(R1' \cdot C1)} \cdot \frac{G2/C2'}{s + 1/(R2 \cdot C2')}$$

here, Vout/Vin(s) is a Laplace transform for a ratio of output signal and input signal;
G1 is equivalent to a transconductance amplifier of said operational amplifier in the reliable charge pump circuit;
R1' is equivalent to a resistor connected between said output node of said operational amplifier and the ground;
C1 is equivalent to a capacitor connected between said output node of said operational amplifier and the ground;
G2 is equivalent to a transconductance amplifier of said NMOS transistor which is connected to said output node of said operational amplifier;
R2 is equivalent to a resistor connected between an drain node of said NMOS transistor which is connected to said output node of said operational amplifier and the ground;
C2' is equivalent to a capacitor connected between said drain node of said NMOS transistor which is connected to said output node of said operational amplifier and the ground;
s is a Laplace operator,
wherein R1'=(R1//R3)/(R1+R3), C2'=C2+C3, given two poles W1=1/(R1'×C1), W2=1/(R2×C2') when W1 gets larger, W2 gets smaller, therefore, said two poles W1, W2 are separated, W1 is far away from W2.

11. The reliable charge pump circuit, as recited in claim 7, wherein an open-loop transfer function of said negative feedback circuit is expressed by the following Equation:

$$\frac{Vout}{Vin}(s) = \frac{G1 \cdot R1'}{1 + R1' \cdot C1s} \cdot \frac{G2 \cdot R2}{1 + R2 \cdot C2's} = \frac{G1/C1}{s + 1/(R1' \cdot C1)} \cdot \frac{G2/C2'}{s + 1/(R2 \cdot C2')}$$

here, Vout/Vin(s) is a Laplace transform for a ratio of output signal and input signal;
G1 is equivalent to a transconductance amplifier of said operational amplifier in the reliable charge pump circuit;
R1' is equivalent to a resistor connected between said output node of said operational amplifier and the ground;
C1 is equivalent to a capacitor connected between said output node of said operational amplifier and the ground;
G2 is equivalent to a transconductance amplifier of said NMOS transistor which is connected to said output node of said operational amplifier;
R2 is equivalent to a resistor connected between an drain node of said NMOS transistor which is connected to said output node of said operational amplifier and the ground;
C2' is equivalent to a capacitor connected between said drain node of said NMOS transistor which is connected to said output node of said operational amplifier and the ground;
s is a Laplace operator,
wherein R1'=(R1//R3)/(R1+R3), C2'=C2+C3, given two poles W1=1/(R1'×C1), W2=1/(R2×C2'), when W1 gets larger, W2 gets smaller, therefore, said two poles W1, W2 are separated, W1 is far away from W2.

12. The reliable charge pump circuit, as recited in claim 8, wherein an open-loop transfer function of said negative feedback circuit is expressed by the following Equation:

$$\frac{Vout}{Vin}(s) = \frac{G1 \cdot R1'}{1 + R1' \cdot C1s} \cdot \frac{G2 \cdot R2}{1 + R2 \cdot C2's} = \frac{G1/C1}{s + 1/(R1' \cdot C1)} \cdot \frac{G2/C2'}{s + 1/(R2 \cdot C2')}$$

here, Vout/Vin(s) is a Laplace transform for a ratio of output signal and input signal;

G1 is equivalent to a transconductance amplifier of said operational amplifier in the reliable charge pump circuit;

R1' is equivalent to a resistor connected between said output node of said operational amplifier and the ground;

C1 is equivalent to a capacitor connected between said output node of said operational amplifier and the ground;

G2 is equivalent to a transconductance amplifier of said NMOS transistor which is connected to said output node of said operational amplifier;

R2 is equivalent to a resistor connected between an drain node of said NMOS transistor which is connected to said output node of said operational amplifier and the ground;

C2' is equivalent to a capacitor connected between said drain node of said NMOS transistor which is connected to said output node of said operational amplifier and the ground;

s is a Laplace operator, wherein R1'=(R1//R3)/(R1+R3), C2'=C2+C3, given two poles W1=1/(R1'×C1), W2=1/(R2×C2'), when W1 gets larger, W2 gets smaller, therefore, said two poles W1, W2 are separated, W1 is far away from W2.

* * * * *

UNITED STATES PATENT AND TRADEMARK OFFICE
CERTIFICATE OF CORRECTION

| | | |
|---|---|---|
| PATENT NO. | : 8,179,175 B2 | Page 1 of 1 |
| APPLICATION NO. | : 12/793667 | |
| DATED | : May 15, 2012 | |
| INVENTOR(S) | : Weiyun Tang | |

It is certified that error appears in the above-identified patent and that said Letters Patent is hereby corrected as shown below:

On the Title Page, Item (73), should be IPGoal Microelectronics (SiChuan) Co., Ltd. instead of IPGoal Microelectronics (SiChaun) Co., Ltd..

Signed and Sealed this
Twenty-fourth Day of July, 2012

David J. Kappos
*Director of the United States Patent and Trademark Office*